United States Patent
Cases et al.

(10) Patent No.: US 7,443,180 B2
(45) Date of Patent: Oct. 28, 2008

(54) ON-CHIP PROBING APPARATUS

(75) Inventors: Moises Cases, Austin, TX (US); Daniel N. de Araujo, Cedar Park, TX (US); Bradley D. Herrman, Cary, NC (US); Erdem Matoglu, Austin, TX (US); Bhyrav M. Mutnury, Austin, TX (US); Pravin S. Patel, Cary, NC (US); Nam H. Pham, Round Rock, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/567,449

(22) Filed: Dec. 6, 2006

(65) Prior Publication Data

US 2008/0136427 A1    Jun. 12, 2008

(51) Int. Cl.
    *G01R 31/02*    (2006.01)
    *G01R 31/26*    (2006.01)
(52) U.S. Cl. ........................ 324/754; 324/765
(58) Field of Classification Search .......... 324/754–765
    See application file for complete search history.

(56) References Cited

U.S. PATENT DOCUMENTS

| | | | | |
|---|---|---|---|---|
| 4,340,860 A * | 7/1982 | Teeple, Jr. | ................... | 324/758 |
| 4,719,411 A * | 1/1988 | Buehler | ...................... | 324/73.1 |
| 5,160,779 A | 11/1992 | Sugihara | | |
| 5,418,470 A * | 5/1995 | Dagostino et al. | ............ | 324/763 |
| 5,469,075 A * | 11/1995 | Oke et al. | .................... | 324/763 |
| 5,905,383 A * | 5/1999 | Frisch | ........................ | 324/765 |
| 6,068,892 A | 5/2000 | Ma | | |
| 6,094,056 A | 7/2000 | Bardsley et al. | | |
| 6,275,051 B1 | 8/2001 | Bachelder et al. | | |
| 6,356,096 B2 * | 3/2002 | Takagi et al. | ................. | 324/765 |
| 6,466,042 B1 | 10/2002 | Nam | | |
| 6,535,013 B2 | 3/2003 | Samaan | | |
| 6,654,919 B1 | 11/2003 | Watkins | | |
| 6,714,030 B2 * | 3/2004 | Kohno et al. | ................. | 324/754 |
| 6,731,128 B2 | 5/2004 | Das et al. | | |
| 6,834,360 B2 | 12/2004 | Corti et al. | | |
| 6,949,940 B2 * | 9/2005 | Schmid et al. | .............. | 324/763 |
| 6,970,005 B2 | 11/2005 | Rincon et al. | | |
| 7,245,134 B2 * | 7/2007 | Granicher et al. | ............ | 324/754 |
| 7,262,620 B2 * | 8/2007 | de la Puente et al. | ........ | 324/761 |
| 7,342,404 B2 * | 3/2008 | Schmid et al. | .............. | 324/763 |
| 2002/0008529 A1 | 1/2002 | Wilson et al. | | |

FOREIGN PATENT DOCUMENTS

JP    2000304773 A    11/2000

\* cited by examiner

*Primary Examiner*—Ha Nguyen
*Assistant Examiner*—Joshua Benitez
(74) *Attorney, Agent, or Firm*—Cynthia S. Byrd; Hoffman Warnick LLC

(57) ABSTRACT

The invention is directed to an on-chip probing apparatus. In accordance with an embodiment of the present invention, the on-chip probing apparatus includes: a plurality of switches on a chip; a plurality of externally accessible probe points on the chip; and a multiplexer for controlling the plurality of switches to selectively couple an output signal of the chip to one of the plurality of probe points.

6 Claims, 2 Drawing Sheets

ON-CHIP PROBING APPARATUS

BACKGROUND OF THE INVENTION

1. Field of the Invention

The present invention generally relates to the testing of integrated circuits (chips). More specifically, the present invention is directed to an on-chip probing apparatus.

2. Related Art

To assess the interconnection of a high performance package and system, there is a need to probe at the chip-pad interface while the device is in operation. One existing solution connects the probe point to the tester using a simple trace. Unfortunately, the trace itself produces an unwanted stub effect into the probe and signal under test. Further, multiple test points become expensive in view of package real estate and pin count.

Accordingly, there is a need for an on-chip probing apparatus that obviates the deficiencies of the prior art.

SUMMARY OF THE INVENTION

The present invention is directed to an on-chip probing apparatus. In particular, in one embodiment, the present invention provides a test probe, implemented directly into the silicon of the chip, which employs CMOS (complementary metal-oxide semiconductor) switches connected to the signal pins. A MUX (multiplexer) is employed to control which signal is being tested. The on-chip probing apparatus of the present invention incurs negligible cost to the package, a modest cost to the chip silicon, but offers an in-situ testing capability not only to the chip-pad interface but also to any point within the silicon.

A first aspect of the present invention is directed to an on-chip probing apparatus, comprising: a plurality of switches on a chip; a plurality of externally accessible probe points on the chip; and a multiplexer for controlling the plurality of switches to selectively couple an output signal of the chip to one of the plurality of probe points.

A second aspect of the present invention is directed to an integrated circuit, comprising: a plurality of switches on a chip; a plurality of externally accessible probe points on the chip; and a multiplexer for controlling the plurality of switches to selectively couple one of a plurality of output signals of the chip to one of the plurality of probe points.

The illustrative aspects of the present invention are designed to solve the problems herein described and other problems not discussed.

BRIEF DESCRIPTION OF THE DRAWINGS

These and other features of this invention will be more readily understood from the following detailed description of the various aspects of the invention taken in conjunction with the accompanying drawings.

Figure 1:
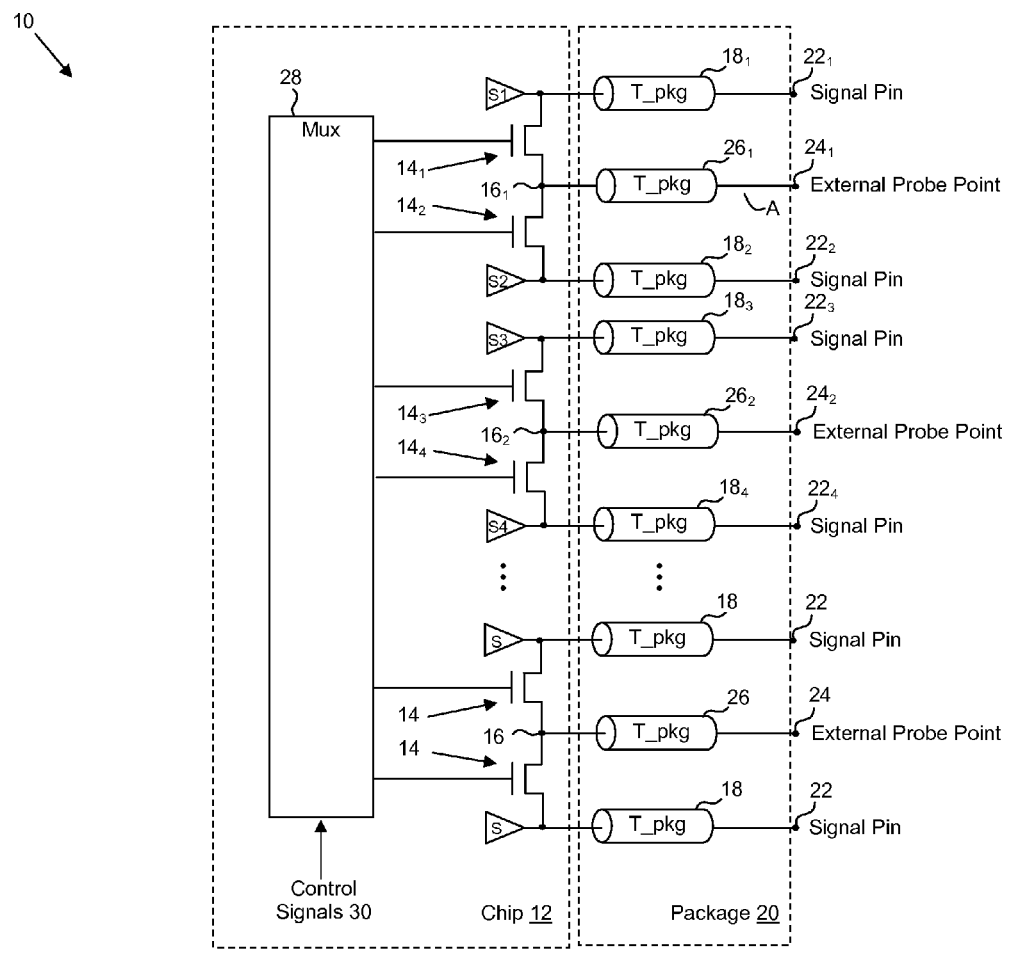
FIG. 1 depicts an illustrative on-chip probing apparatus in accordance with an embodiment of the present invention.

The drawings are merely schematic representations, not intended to portray specific parameters of the invention. The drawings are intended to depict only typical embodiments of the invention, and therefore should not be considered as limiting the scope of the invention. In the drawings, like numbering represents like elements.

DETAILED DESCRIPTION OF THE INVENTION

As described above, the present invention is directed to an on-chip probing apparatus. In particular, in one embodiment, the present invention is directed to an on-chip probing apparatus that provides a test probe, implemented directly into the silicon of the chip, which employs CMOS (complementary metal-oxide semiconductor) switches connected to the signal pins. A MUX (multiplexer) is employed to control which signal is being tested. The on-chip probing apparatus of the present invention incurs negligible cost to the package, a modest cost to the chip silicon, but offers an in-situ testing capability not only to the chip-pad interface but also to any point within the silicon.

Figure 2:
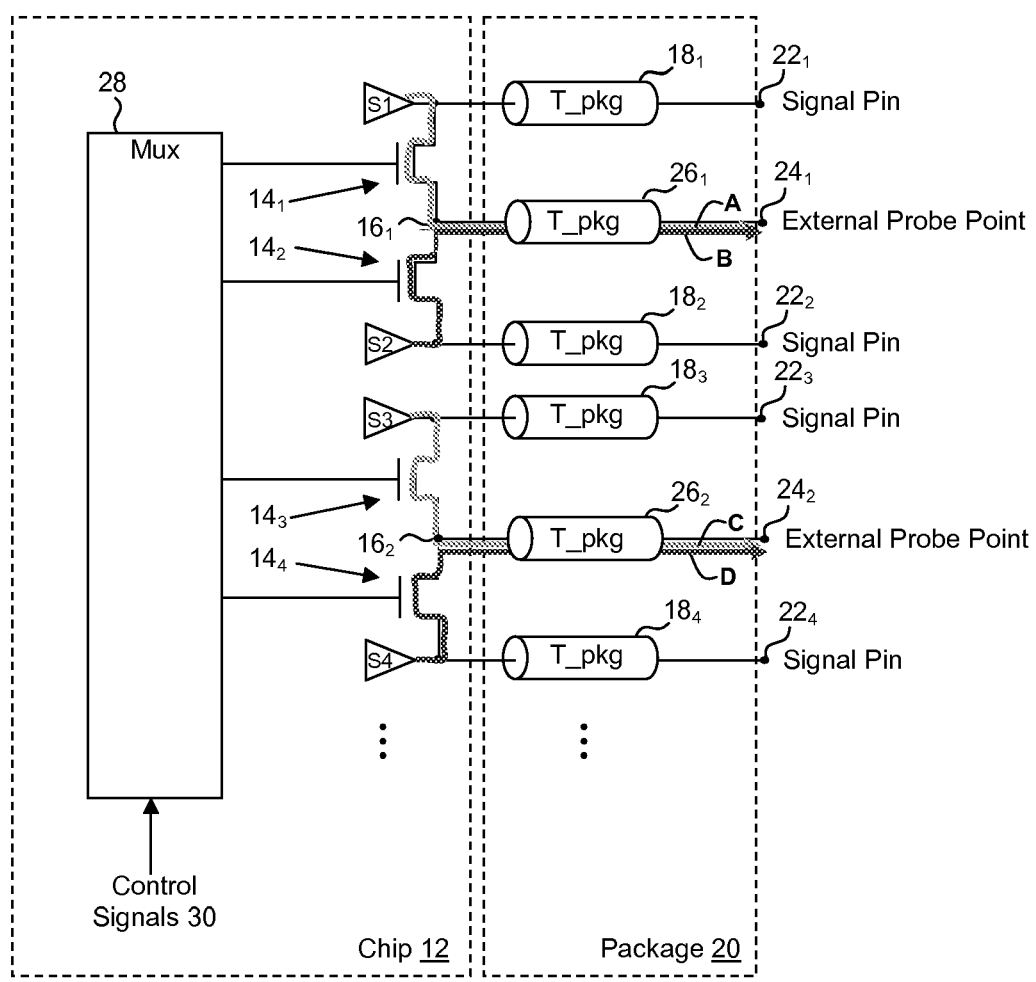
FIG. 2 depicts examples of the operation of the illustrative on-chip probing apparatus of FIG. 1 in accordance with an embodiment of the present invention.

An illustrative on-chip probing apparatus 10 in accordance with an embodiment of the present invention is depicted in FIG. 1. The chip 12 includes a plurality of CMOS switches 14 formed on the chip 12. Each CMOS switch 14 is connected on one end to a probe point 16 on the chip and on the other end to a chip connection (e.g., a controlled collapsible chip connection (C4)), which is wired as a signal trace T_pkg 18 in the package 20 and accessed by a signal pin 22. The CMOS is doped to about 450 ohms to provide 10:1 signal to probe ratio. External access 24 to a probe point 16 is provided via a signal trace T_pkg 26 in the package 20. It should be noted that the chip 12 can include any number of CMOS switches 14, probe points 16, and signal outputs S. Further, it should be noted that the package 20 can include any number of signal traces T_pkg 18, signal pins 22, external probe points 24, and signal traces T_pkg 26. As such, the specific structure of the illustrative embodiment illustrated in FIGS. 1 and 2 is not intended to be limiting in any way.

A MUX 28 controls which signal of the chip 12 is to be tested. Control signals 30 are used to control the MUX 28. Register bits or other suitable mechanisms can be used to set the control signals 30 during a sense mode of the on-chip probing apparatus 10. For example, in a first case, the control signals 30 are set such that the MUX 28 switches on the CMOS switch $14_1$ during a sense mode of the on-chip probing apparatus 10. As a result, the signal at the probe point $16_1$, corresponding to the signal output S1 of the chip 12, can be accessed at the external probe point $24_1$ as indicated by arrow A in FIG. 2. In a second case, the control signals 30 are set such that the MUX 28 switches on the CMOS switch $14_2$ during a sense mode of the on-chip probing apparatus 10. As a result, the signal at the probe point $16_1$, corresponding to the signal output S2 of the chip 12, can be accessed at the external probe point $24_1$ as indicated by arrow B in FIG. 2. It should be noted that any number of CMOS switches 14 and signal outputs S can be associated with a given probe point 16. For example, the CMOS switches $14_1$, $14_2$, $14_3$, $14_4$, associated with signal outputs S1, S2, S3, S4, can be coupled to probe point $16_1$. The switches are controlled by the MUX 28 in response to the control signals 30. Other configurations are also possible.

Continuing the above example, in a third case, the control signals 30 are set such that the MUX 28 switches on the CMOS switch $14_3$ during a sense mode of the on-chip probing apparatus 10. As a result, the signal at the probe point $16_2$, corresponding to the signal output S3 of the chip 12, can be accessed at the external probe point $24_2$ as indicated by arrow C in FIG. 2. In a fourth case, the control signals 30 are set such that the MUX 28 switches on the CMOS switch $14_4$ during a sense mode of the on-chip probing apparatus 10. As a result, the signal at the probe point $16_2$, corresponding to the signal output S4 of the chip 12, can be accessed at the external probe point $24_2$ as indicated by arrow D in FIG. 2.

The on-chip probing apparatus 10 of the present invention has three different modes of operation: test; sense; and functional. In test mode (e.g., under JTAG control), the on-chip probing apparatus 10 is calibrated before use. In sense mode, the on-chip probing apparatus 10 is in operation, and each probe point 16 is selected (e.g., by setting a register bit controlling the MUX 28). In functional mode, the MUX 28 disables all of the probe points 16. The trace length (both in package and chip) of the external probe point can be de-embedded using either analytical or measurement based approaches for more accurate on-chip measurements.

Some aspects of the present invention can be provided on a computer-readable medium that includes computer program code for carrying out and/or implementing the various process steps of the present invention, when loaded and executed in a computer system. It is understood that the term "computer-readable medium" comprises one or more of any type of physical embodiment of the computer program code. For example, the computer-readable medium can comprise computer program code embodied on one or more portable storage articles of manufacture, on one or more data storage portions of a computer system, such as memory and/or a storage system, and/or as a data signal traveling over a network (e.g., during a wired/wireless electronic distribution of the computer program code).

The foregoing description of the embodiments of this invention has been presented for purposes of illustration and description. It is not intended to be exhaustive or to limit the invention to the precise form disclosed, and many modifications and variations are possible.

What is claimed is:

1. An on-chip probing apparatus, comprising:
   a plurality of externally accessible probe points on a chip, wherein each probe point is associated with, and selectively connectable to, a different pair of output signals of the chip;
   a switching circuit coupled to each probe point and the pair of output signals associated with the probe point, the switching circuit comprising a first switch for selectively connecting a first of the pair of output signals to the probe point and a second switch for selectively connecting a second of the pair of output signals to the probe point;
   a multiplexer for controlling the first and second switches in each switching circuit to selectively connect an output signal of the chip to a respective probe point on the chip; and
   a package for the chip;
   wherein the package includes a plurality of external probe points for accessing the probe points on the chip, and a plurality of signal pins, separate from the external probe points, for accessing the output signals of the chip.

2. The apparatus of claim 1, wherein the plurality of switches on the chip comprise complementary metal-oxide semiconductor (CMOS) switches.

3. The apparatus of claim 1, further comprising:
   a plurality of signal traces in the package for providing external access to the probe points on the chip and the output signals of the chip.

4. An integrated circuit, comprising:
   a plurality of externally accessible probe points on the integrated circuit, wherein each probe point is associated with, and selectively connectable to, a different pair of output signals of the integrated circuit;
   a switching circuit coupled to each probe point and the pair of output signals associated with the probe point, the switching circuit comprising a first switch for selectively connecting a first of the pair of output signals to the probe point and a second switch for selectively connecting a second of the pair of output signals to the probe point;
   a multiplexer for controlling the first and second switches in each switching circuit to selectively connect an output signal of the integrated circuit to a respective probe point on the chip; and
   a package for the integrated circuit;
   wherein the package includes a plurality of external probe points for accessing the probe points on the integrated circuit, and a plurality of signal pins, separate from the external probe points, for accessing the output signals of the integrated circuit.

5. The integrated circuit of claim 4, wherein the plurality of switches on the chip comprise complementary metal-oxide semiconductor (CMOS) switches.

6. The integrated circuit of claim 4, further comprising:
   a plurality of signal traces in the package for providing external access to the probe points on the chip and the output signals of the chip.

* * * * *